US006424019B1

(12) United States Patent
Hsia et al.

(10) Patent No.: US 6,424,019 B1
(45) Date of Patent: Jul. 23, 2002

(54) SHALLOW TRENCH ISOLATION CHEMICAL-MECHANICAL POLISHING PROCESS

(75) Inventors: Shouli Steve Hsia; Yanhua Wang, both of San Jose; Jayanthi Pallinti, Santa Clara, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/507,042

(22) Filed: Feb. 18, 2000

Related U.S. Application Data

(62) Division of application No. 09/098,635, filed on Jun. 16, 1998, now Pat. No. 6,060,370.

(51) Int. Cl.[7] .................. H01C 29/00; H01C 23/48; H01C 23/52; H01C 29/40
(52) U.S. Cl. .................. 257/499; 257/501; 257/506; 257/752
(58) Field of Search ................... 257/752, 499, 257/500, 501, 506; 438/691, 692, 700

(56) References Cited

U.S. PATENT DOCUMENTS

| | | |
|---|---|---|
| 4,793,895 A | 12/1988 | Kaanta et al. |
| 5,036,015 A | 7/1991 | Sandhu et al. |
| 5,081,421 A | 1/1992 | Miller et al. |
| 5,151,584 A | 9/1992 | Ebbing et al. |
| 5,169,491 A | 12/1992 | Doan |
| 5,196,353 A | 3/1993 | Sandhu et al. |
| 5,222,329 A | 6/1993 | Yu |
| 5,240,552 A | 8/1993 | Yu et al. |
| 5,245,790 A | 9/1993 | Jerbic |
| 5,245,794 A | 9/1993 | Salugsugan |
| 5,265,378 A | 11/1993 | Rostoker |
| 5,272,115 A | 12/1993 | Sato |
| 5,308,438 A | 5/1994 | Cote et al. |
| 5,310,455 A | 5/1994 | Pasch et al. |
| 5,321,304 A | 6/1994 | Rostoker |
| 5,337,015 A | 8/1994 | Lustig et al. |
| 5,389,194 A | 2/1995 | Rostoker et al. |
| 5,399,234 A | 3/1995 | Yu et al. |
| 5,403,228 A | 4/1995 | Pasch |
| 5,405,806 A | 4/1995 | Pfeister et al. |
| 5,439,551 A | 8/1995 | Meikle et al. |

(List continued on next page.)

*Primary Examiner*—Eddie Lee
*Assistant Examiner*—Jesse A. Fenty
(74) *Attorney, Agent, or Firm*—Beyer, Weaver & Thomas, LLP

(57) ABSTRACT

A process for fabricating a trench filled with an insulating material in a surface of an integrated circuit substrate is described. One step of the process includes defining a masking layer on a composite layered stack above a region to be protected on the integrated circuit substrate surface. The composite layered stack includes a layer of a first material and a polishing stopping layer. The layer of the first material has a polishing rate by chemical mechanical polishing that is greater than a polishing rate by chemical mechanical polishing of the insulating material. Another step of the process includes etching through the composite layered stack and the integrated circuit substrate to form the trench in the integrated circuit substrate surface and depositing the insulating material on the integrated circuit substrate surface such that the trench is filled with the insulating material. A yet another step of the process includes polishing the integrated circuit substrate surface to remove a substantial portion of the composite layered stack and a portion of the insulating material adjacent to the composite layered stack at about a same rate. The polishing step facilitates in forming a substantially planar surface of the insulating material above the trench and reducing a likelihood of forming of a concave region near a middle region of the surface of the insulating material. The concave region recesses inwardly into the surface of the insulating material in the trench.

4 Claims, 4 Drawing Sheets

U.S. PATENT DOCUMENTS

| | | | | |
|---|---|---|---|---|
| 5,483,568 | A | 1/1996 | Yano et al. | |
| 5,492,594 | A | 2/1996 | Burke et al. | |
| 5,516,400 | A | 5/1996 | Pasch et al. | |
| 5,531,861 | A | 7/1996 | Yu et al. | |
| 5,559,428 | A | 9/1996 | Li et al. | |
| 5,561,541 | A | 10/1996 | Sharp et al. | |
| 5,595,526 | A | 1/1997 | Yau et al. | |
| 5,597,442 | A | 1/1997 | Chen et al. | |
| 5,609,511 | A | 3/1997 | Moriyama et al. | |
| 5,624,304 | A | 4/1997 | Pasch et al. | |
| 5,626,715 | A | 5/1997 | Rostoker | |
| 5,637,185 | A | 6/1997 | Murarka et al. | |
| 5,639,388 | A | 6/1997 | Kimura et al. | |
| 5,643,046 | A | 7/1997 | Katakabe et al. | |
| 5,643,050 | A | 7/1997 | Chen | |
| 5,644,221 | A | 7/1997 | Li et al. | |
| 5,647,952 | A | 7/1997 | Chen | |
| 5,658,183 | A | 8/1997 | Sandhu et al. | |
| 5,660,672 | A | 8/1997 | Li et al. | |
| 5,663,797 | A | 9/1997 | Sandhu | |
| 5,664,987 | A | 9/1997 | Renteln | |
| 5,667,424 | A | 9/1997 | Pan | |
| 5,667,433 | A | 9/1997 | Mallon | |
| 5,667,629 | A | 9/1997 | Pan et al. | |
| 5,668,063 | A | 9/1997 | Fry et al. | |
| 5,670,410 | A | 9/1997 | Pan | |
| 5,672,091 | A | 9/1997 | Takahashi et al. | |
| 5,674,784 | A | 10/1997 | Jang et al. | |
| 5,695,660 | A | 12/1997 | Litvak | |
| 5,700,180 | A | 12/1997 | Sandhu et al. | |
| 5,705,435 | A | 1/1998 | Chen | |
| 5,710,076 | A | 1/1998 | Dai et al. | |
| 5,712,185 | A | 1/1998 | Tsai et al. | |
| 5,722,875 | A | 3/1998 | Iwashita et al. | |
| 5,741,171 | A | 4/1998 | Sarfaty et al. | |
| 5,777,739 | A | 7/1998 | Sandhu et al. | |
| 5,861,055 | A | 1/1999 | Allman et al. | |
| 5,865,666 | A | 2/1999 | Nagahara | |
| 5,868,608 | A | 2/1999 | Allman et al. | |
| 5,882,251 | A | 3/1999 | Berman et al. | |
| 5,888,120 | A | 3/1999 | Doran | |
| 5,893,756 | A | 4/1999 | Berman et al. | |
| 5,928,961 | A * | 7/1999 | Lou et al. | 438/692 |
| 5,931,719 | A | 8/1999 | Nagahara et al. | |
| 5,948,697 | A | 9/1999 | Hata | |
| 5,957,757 | A | 9/1999 | Berman | |
| 6,143,625 | A * | 11/2000 | Chen et al. | 438/435 |
| 6,207,533 | B1 * | 3/2001 | Gao | 438/424 |
| 6,277,707 | B1 * | 8/2001 | Lee et al. | 438/430 |
| 6,350,662 | B1 * | 2/2002 | Thei et al. | 438/435 |
| 6,365,506 | B1 * | 4/2002 | Chang et al. | 438/624 |
| 6,368,931 | B1 * | 4/2002 | Kohn et al. | 438/359 |

\* cited by examiner

US 6,424,019 B1

SHALLOW TRENCH ISOLATION CHEMICAL-MECHANICAL POLISHING PROCESS

This is a Divisional application of prior application Ser. No. 09/098,635, filed on Jun. 16, 1998, U.S. Pat. No. 6,060,370.

BACKGROUND OF THE INVENTION

The present invention relates to shallow trench isolation (STI) processes employed in the fabrication of integrated circuits (ICs). The present invention more particularly relates to modified shallow trench isolation (STI) processes that include forming composite layered stacks become chemical-mechanical polishing of the integrated circuit (IC) substrate surfaces.

As the current IC technology moves to smaller feature sizes and the density of IC features in an IC substrate surface increases, STI processes are replacing the local oxidation of silicon (LOCOS) isolation methods as the process of choice for isolating active areas in Complementary Metal Oxide Semiconductor (CMOS) circuits, for example. Local oxidation of silicon (LOCOS) isolation methods are undesired at sub-0.5 $\mu$m dimensions and lower because they typically introduce non-planarity and a "bird's beak" at the edge of an active area and therefore reduce the packing density of the circuitry. In contrast, STI processes provide isolation schemes that produce a relatively high degree of planarity and eliminate the bird's beak to dramatically reduce the chip area required for isolation.

FIGS. 1A–C show some major steps of a conventional STI process that may be employed to fabricate trenches in the IC substrate. In order to form a partially fabricated IC substrate 10 (hereinafter referred to as "IC substrate") as shown in FIG. 1A, a native oxide layer 24, e.g., a silicon dioxide layer, is blanket deposited on a surface of an IC substrate layer 12. A polishing stopping mask layer 14, e.g., a silicon nitride layer ($Si_3N_4$), is then blanket deposited over native oxide layer 24.

Next, polishing stopping layer 14, native oxide layer 24 and IC substrate layer 12 are etched through using conventional photolithography techniques well known to those skilled in the art to form trenches 18, 20 and 22 in IC substrate layer 12. Trench 22 is formed in a wide open area and trenches 18 and 20 are formed in a dense area of IC substrate 10. The dense area, as shown in FIG. 1A, has a greater number of trenches per unit area of the IC substrate surface than the wide open area. Those skilled in the art will also recognize that the trenches in the wide open area are also wider than the trenches in the dense area.

An insulating layer 16, e.g., a silicon dioxide layer, is then deposited either by chemical vapor deposition (CVD) or spin-on glass (SOG), for example, on IC substrate 10 filling trenches 18, 20 and 22 with the insulating layer so that subsequently formed active areas in IC substrate 10 are electrically isolated from each other. As shown in FIG. 1A, a portion of insulating layer 16 is also deposited above polishing stopping layer 14 and this portion of insulating layer 16 is referred to as the "insulating layer overburden."

IC substrate 10 is then subject to chemical-mechanical polishing (CMP) to remove the insulating layer overburden and polishing stopping layer 14. CMP typically involves mounting an IC substrate face down on a holder and rotating the IC substrate face against a polishing pad mounted on a platen, which in turn is rotating or is in orbital state. Those skilled in the art will recognize that because insulating layer 14 typically includes $SiO_2$, "oxide CMP" (which refers to the CMP process for polishing $SiO_2$) is typically carried out in this step. During oxide CMP, a slurry composition including $H_2O_2$ (hydrogen peroxide), for example, is introduced between the polishing pad and an IC substrate surface or on the polishing pad near the IC substrate to remove $SiO_2$.

FIG. 1B shows an intermediate structure that is formed during oxide CMP after the insulating layer overburden is removed and polishing stopping layer 14 is exposed. The presence of polishing stopping layer 14 ensures that after oxide CMP has concluded, an appropriate thickness of native oxide layer 24 is maintained above IC substrate layer 12. Those skilled in the art will recognize that a thickness of a native oxide layer has a significant impact on the performance characteristics of an IC.

As shown in FIG. 1B, after the insulating layer overburden is removed, the surface of insulating layer 16 above trenches 18 and 20 is substantially planar. Above trench 22, however, near or about a middle region of the surface of insulating layer 16 (in the wide open area), a concave region or an indented region 26 may be formed. Concave region 26 recesses inwardly into the surface of insulating layer 16 and is referred to as "dishing" because the profile of the concave region resembles the profile of a dish. The degree of dishing can be quantified by measuring the distance between the center of the surface of insulating layer 16 (above trench 22), which is typically the lowest point of the concave region, and the point where the insulating layer levels off, which is typically the highest point of the concave region.

After oxide CMP has concluded and polishing stopping layer 14 is removed, isolation structures (i.e. trenches 18, 20 and 22 filled with insulating material 16) are formed below the IC substrate layer 12, native oxide layer 24 with the appropriate thickness is maintained above the IC substrate layer and the substantially planar surface of insulating layer 16 above trenches 18 and 20 is preserved, as shown in FIG. 1C. The degree of dishing, however, in the wide open area above trench 22 may increase and the resulting concave region shown in FIG. 1C by reference numeral 26' may recess inwardly into the surface of insulating layer 16 to a greater extent because during oxide CMP a material removal rate of the insulating layer (e.g., $SiO_2$) is higher than a material removal rate of the polishing stopping layer (e.g., $Si_3N_4$). Thus, oxide CMP has a high selectivity to the polishing stopping layer. After the isolation structures shown in FIG. 1C are formed the IC fabrication process typically proceeds to forming IC features of active areas, e.g., transistor devices.

Unfortunately, the conventional STI process described above fails to provide trench isolation structures that effectively isolate active areas from each other. By way of example, the undesirable effect of dishing described above in detail may provide an electrically conductive pathway to charge carriers in a CMOS circuitry between a p-type doped region that may be disposed on one side of trench 22 and a n-type doped region that may be disposed on the other side of trench 22. As a result, electrical leakage over a period of time may result to catastrophic IC failure.

What is therefore needed is an improved STI process that reduces the likelihood of dishing and produces isolation structures or trenches filled with an insulating material having substantially planar surfaces that effectively isolate active areas in an IC from each other.

SUMMARY OF THE INVENTION

To achieve the foregoing, in one aspect, the present invention provides a process for fabricating a trench filled with an insulating material in a surface of an integrated circuit substrate. One step of the process includes defining a masking layer on a composite layered stack above a region to be protected on the integrated circuit substrate surface. The composite layered stack includes a layer of a first material and a polishing stopping layer. The layer of the first material has a polishing rate by chemical mechanical polishing that is greater than a polishing rate by chemical mechanical polishing of the insulating material. Another step of the process includes etching through the composite layered stack and the integrated circuit substrate to form the trench in the integrated circuit substrate surface and depositing the insulating material on the integrated circuit substrate surface such that the trench is filled with the insulating material. A yet another step of the process includes polishing the integrated circuit substrate surface to remove a substantial portion of the composite layered stack and a portion of the insulating material adjacent to the composite layered stack at about a same rate. The polishing step facilitates in forming a substantially planar surface of the insulating material above the trench and reducing a likelihood of forming of a concave region near a middle region of the surface of the insulating material. The concave region recesses inwardly into the surface of the insulating material in the trench.

The process ma)y further include forming a plurality of transistors in the integrated circuit substrate and the plurality of the transistors are electrically isolated from each other by a plurality of the trenches. The integrated circuit substrate may be a semiconductor wafer substrate. The process may further still include depositing a layer of native oxide on the integrated circuit substrate surface before defining the masking layer and the step of etching in the above-described process includes etching through the native oxide layer to form the trench. The process may further still include removing the masking layer from the layer of the first material by wet etching or ashing.

The step of defining the masking layer on the composite layered stack may includes: (1) blanket depositing the polish stopping layer above the integrated circuit substrate surface; (2) blanket depositing the layer of the first material on the polish stopping layer to form the composite layered stack; (3) blanket depositing the masking layer on the layer of the first material; and (4) exposing the masking layer to a light source and developing the masking layer to define the mask on the layer of the first material. The layer of the first material includes at least one material selected from the group consisting of tungsten, doped silicon dioxide (e.g., borophosphosilicate glass or phosophosilicate glass containing boron or phosphorous from between about 0.1% and about 90%) and polymer and the polishing stopping layer includes at least one material selected from the group of silicon nitride and silicon oxynitride (e.g., $SiO_xN_y$ or SiON).

A chemical-mechanical polishing removal rate of the layer of the first material is faster than a chemical-mechanical polishing removal rate of the insulating layer, e.g., silicon dioxide, by between about 50% and about 200%. The step of depositing the insulating material may include depositing a layer of silicon dioxide.

In one embodiment of the present invention, the step of polishing the integrated circuit substrate surface includes: (1) a first stage of chemical-mechanical polishing in which polishing is performed under conditions that produce a higher material removal rate of the layer of the first material than a material removal rate of the insulating material disposed adjacent the layer of the first material; and (2) a second stage of chemical-mechanical polishing in which polishing is performed under conditions that promote a higher material removal rate of insulating material disposed adjacent the polishing stopping layer than a material removal rate of the polishing stopping layer.

The above-described step of polishing may further include a pre-first stage of chemical-mechanical polishing that is performed before the first stage of chemical-mechanical polishing for removing the insulating material disposed above the composite layered stack. A substantial portion of the patterned composite layered stack may be exposed after the pre-first stage of chemical-mechanical polishing concludes.

In one embodiment where the layer of the first material includes at least one material selected from the group consisting of tungsten, doped silicon dioxide (e.g., borophosphosilicate glass or phosophosilicate glass containing boron or phosphorous from between about 0.1% and about 90%) and polymer and the insulating material includes silicon dioxide, a slurry composition that includes $Fe(NO_3)_3$ may be employed in the first stage of chemical-mechanical polishing. Furthermore, the polishing stopping layer includes silicon nitride and the insulating material includes silicon dioxide, a slurry composition that includes $H_2O_2$ may be employed in the second stage of chemical-mechanical polishing.

The process of fabricating a trench filled with the insulating material may be a shallow trench isolation process. The trench formed from one embodiment of the inventive process is a trench located in a wide open area on the integrated circuit substrate surface and the wide open area is different from a dense area that includes a greater number of trenches per unit area of integrated circuit substrate surface than the wide open area.

The polishing stopping layer may have a thickness that is between about 2,000 and about 20,000 Angstroms. The layer of the first material may have a thickness that is between about 50% and about 1000% of the thickness of the polishing stopping layer.

In another aspect, the present invention provides a partially fabricated integrated circuit substrate. The a partially fabricated integrated circuit substrate includes: (1) a trench formed in a surface of the partially fabricated integrated circuit substrate; (2) a composite layered stack disposed above a region to be protected on the partially fabricated integrated circuit substrate, the composite layered stack includes a layer of a soft material and a polishing stopping layer; and (3) an insulating layer deposited on the integrated circuit substrate surface filling the trench, wherein a film removal rate of the layer of the soft material is higher than the film removal rate of the insulating layer when the partially fabricated integrated circuit substrate surface is subjected to chemical-mechanical polishing.

The partially fabricated integrated circuit substrate may further include a native oxide layer disposed above the integrated circuit substrate surface and below the composite layered stack. The insulating layer may extend above the composite layered stack. The layer of the soft material may include at least one material selected from the group consisting of tungsten, doped silicon dioxide (e.g., boropllosphosilicate glass or phosophosilicate glass containing boron or phosphorous from between about 0.1% and about 90%) and polymer. The polishing stopping layer may include silicon nitride and silicon oxynitride. The insulating layer may include silicon dioxide. The polishing stopping layer may have a thickness of between about 2,000 and about 20,000 Angstroms. The layer of the soft material may have a thickness that is between about 50% and about 100% of the thickness of the polishing stopping layer.

The modified trench fabrication processes of the present invention represent a marked improvement over the conventional trench fabrication process. By way of example, the present invention reduces the likelihood that the surface of insulating layer above the trench in the wide open area will suffer from dishing. Thus, the trenches fabricated according to the present invention effectively electrically isolate active areas of an IC from each other. Furthermore, the likelihood of encountering problems associated with current leakage is also reduced.

These and other features of the present invention will be described in more detail below in the detailed description of the invention and in conjunction with the following figures.

DETAILED DESCRIPTION OF THE PREFERRED EMBODIMENTS

Figure 1A:
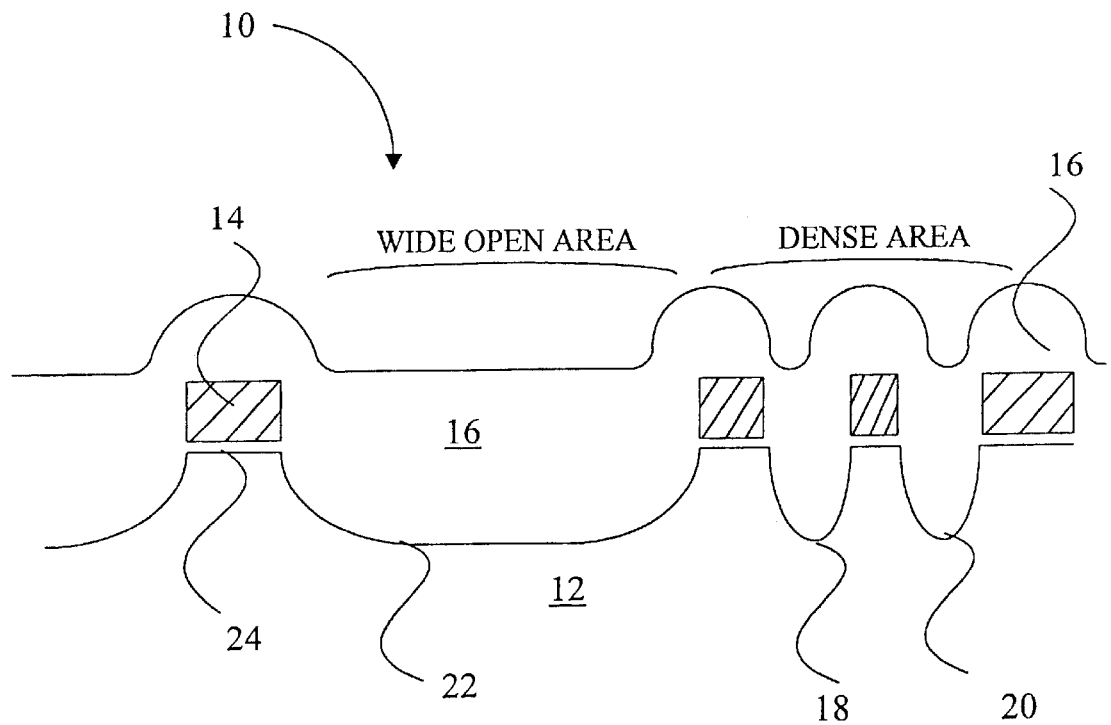
FIGS. 1A–1C show some major steps of a conventional shallow trench isolation process.
Figure 1B:
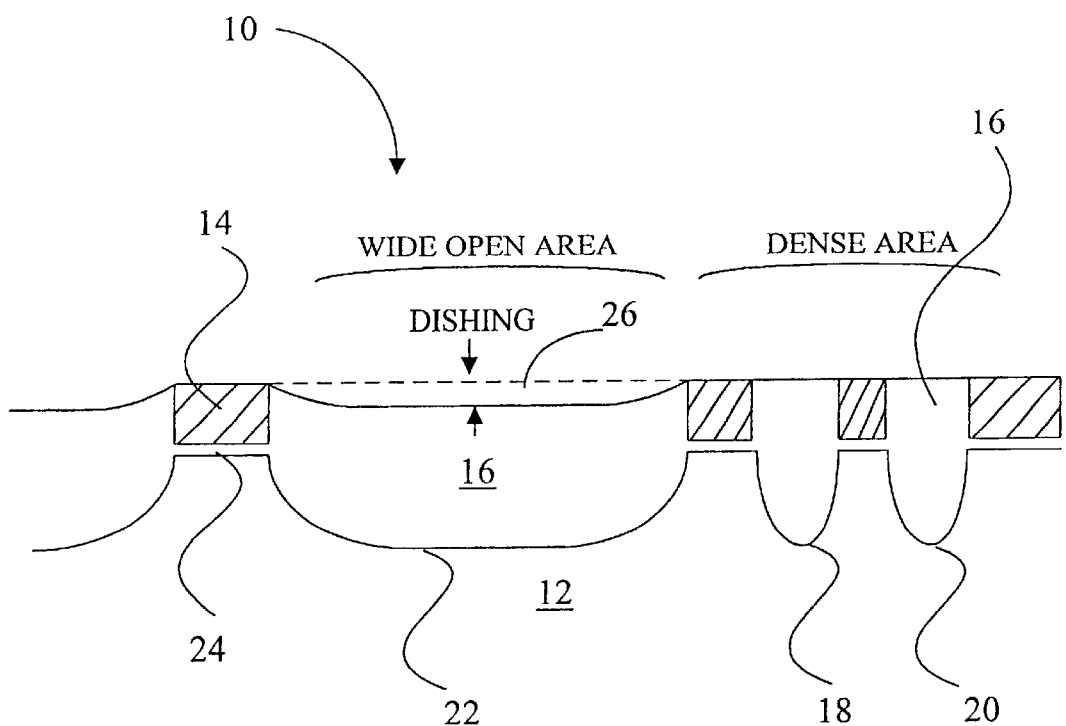
Figure 1C:
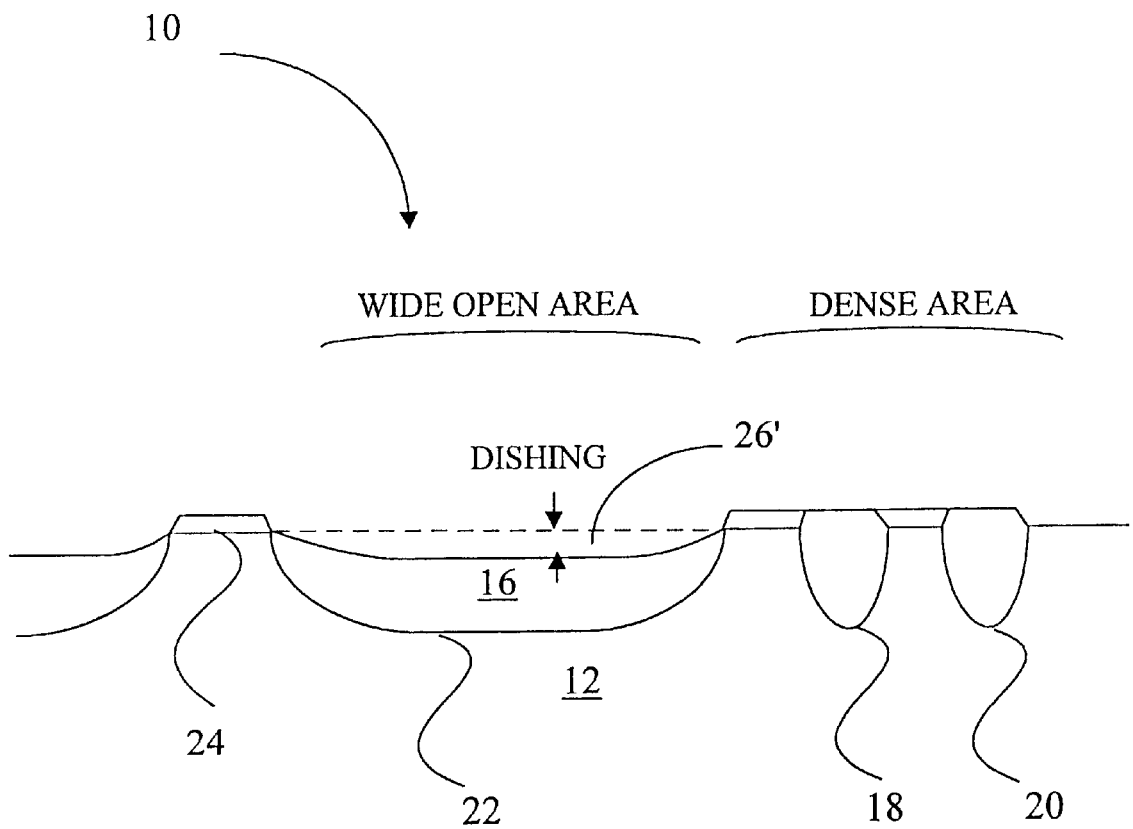

To achieve the foregoing, the present invention provides modified shallow trench isolation (STI) processes that reduce the likelihood of dishing. In the following description, numerous specific details are set forth in order to provide a thorough understanding of the present invention. It will be apparent, however, to those skilled in the art, that the present invention may be practiced without some or all of the specific details. In other instances, well known process steps have not been described in detail in order to not unnecessarily obscure the invention.

The modified shallow trench isolation (STI) process, according to one embodiment of the present invention, employs a composite layered stack, which includes a polishing stopping layer and a layer of a soft material. In this embodiment, during chemical-mechanical polishing (CMP), a material removal rate of the composite layered stack and a material removal rate of a portion of an insulating layer adjacent to the composite layered stack are about the same. Consequently, the resulting surface of the insulating layer above the trenches (especially in the wide open area) are substantially planar. The present invention accomplishes substantially similar material removal rates for the composite layered stack and insulating layer (adjacent to the composite layered stack) by employing a layer of soft material (in the composite layered stack) that polishes faster than the insulating layer.

In one embodiment of the present invention, CMP of the IC substrate surface may be conducted in two different stages, a first stage of chemical-mechanical polishing (CMP) and a second stage of CMP. During a first stage of CMP when the layer of soft material on the IC substrate surface is removed, a higher selectivity to the insulating layer produces a protruding dome shaped insulating layer above the trench in the wide open area. The term selectivity, as used in connection with the description of this invention, refers to the ratio of a material removal rate of a film or material, e.g., a layer of soft material, to a material removal rate of an underlying film or material, e.g., insulating material. The presence of relatively thicker, protruding dome shaped insulating material present adjacent to polishing stopping layer 114 and at the end of the first stage of CMP compensates for dishing that may result from the second stage of CMP, which is substantially similar to conventional oxide CMP and is known for its high selectivity to the polishing stopping layer. Thus, the present invention combats dishing of the trenches in the wide open area by allowing a greater thickness of insulating material to be formed above the trench in the wide open area before the second stage of CMP commences.

Alternatively, in another embodiment of the present invention, CMP of the IC substrate is conducted in a single stage, during which the CMP conditions, e.g., slurry composition, may not change. In this embodiment, the presence of a material in the layered stack that has a faster film removal rate than the surrounding insulating material produces a substantially planar surface above the trench.

Figure 2A:
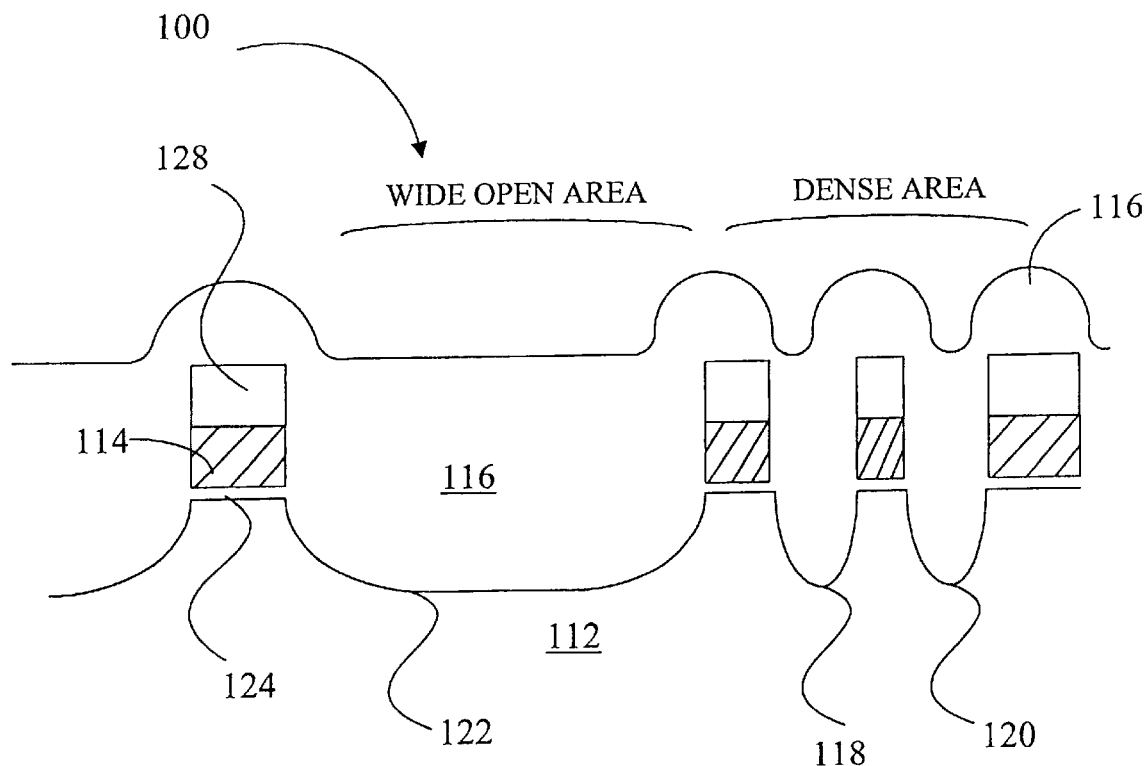
FIG. 2A–2D show some major steps of a modified shallow trench isolation process, according to one embodiment of the present invention.
Figure 2B:
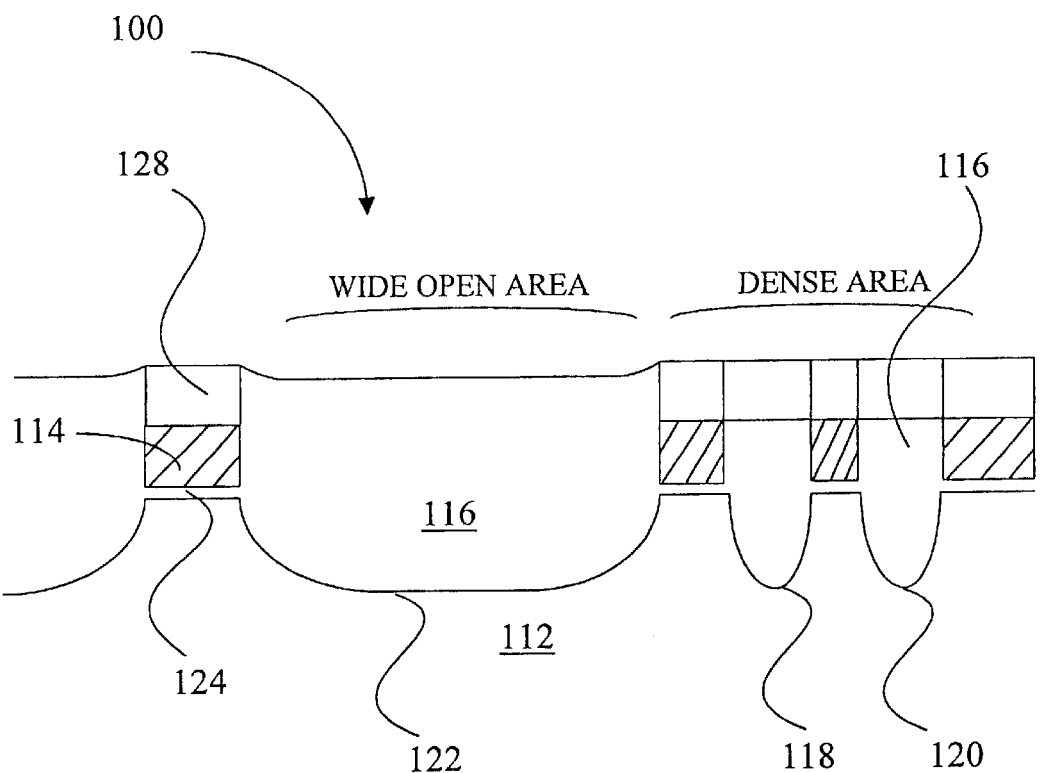
Figure 2C:
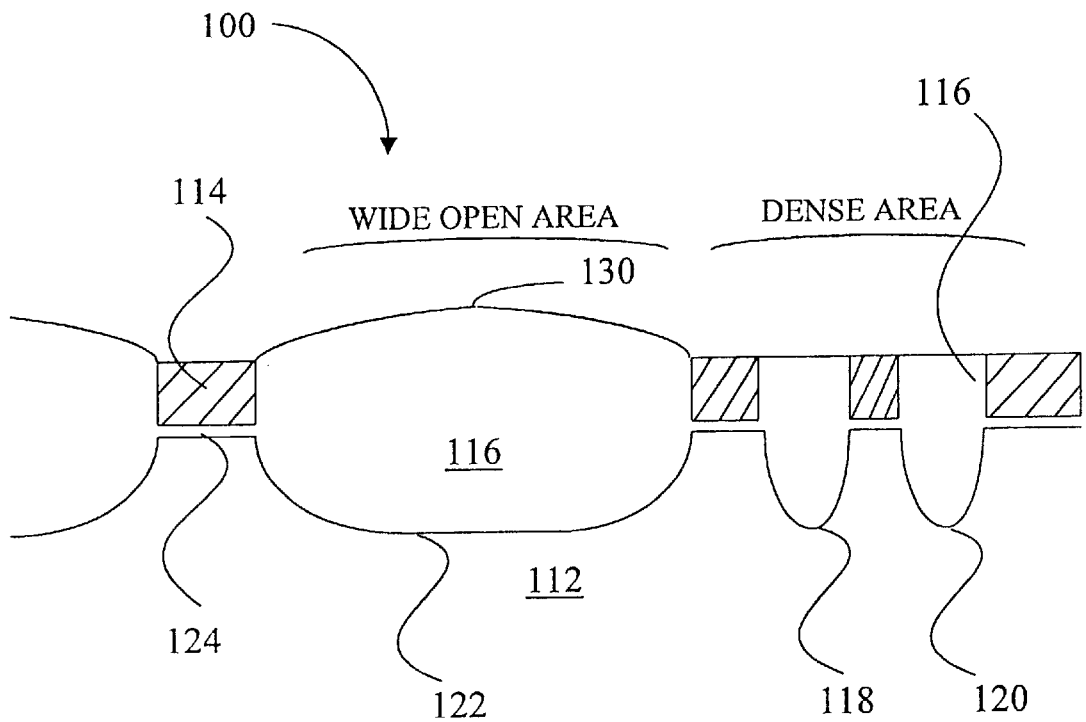

FIGS. 2A–2C show significant steps of a modified STI process, according to one embodiment of the present invention. In order to form partially fabricated integrated circuit (IC) 100 as shown in FIG. 2A, a native oxide layer 124, e.g., a silicon dioxide layer, is blanket deposited on a surface of IC substrate 100. A polishing stopping layer 114 is then blanket deposited over native oxide layer 124. Polishing stopping layer 114 may include at least one of silicon nitride ($Si_3N_4$) and silicon oxynitride (e.g., $SiO_xN_y$, or SiON). As mentioned before, the presence of polishing stopping layer 114 ensures that after oxide CMP has concluded, an appropriate thickness of native oxide layer 124 is maintained above the IC substrate surface. The thickness of polishing stopping layer 114 may vary depending on various factors, e.g., CMP selectivity of the polishing stopping layer to the insulating layer, stress applied by the polishing stopping layer on the silicon substrate, or the ability of the insulating material to fill subsequently formed trenches having the appropriate aspect ratio. In one embodiment, however, polishing stopping layer 114 has a thickness that is between about 2,000 and about 20,000 Angstroms.

Next, a layer of soft material 128 is deposited above polishing stopping layer 114 to form a composite layered stack above the IC substrate surface. During CMP, layer of soft material 128 has a faster film removal rate than an insulating layer 116 shown in FIG. 2A. As a result, in a subsequent CMP step, layer of soft material 128 is polished at a faster rate than insulating layer 116 that is disposed adjacent to layer of soft material 128. In one embodiment, layer of soft material 128 has a film removal rate that is faster than a film removal rate of insulating layer by between about 50% and about 200%. The layer of soft material includes at least one material selected from the group consisting of tungsten, doped silicon dioxide (e.g., borophosphosilicate glass or phosophosilicate glass containing boron or phosphorous from between about 0.1% and about 90%) and polymer. The thickness of layer of soft material 128 deposited on polishing stopping layer 114 may generally be between about 50% and about 1000% (ten times) the thickness of the polishing stopping layer and preferably be between about 100% and about 200% the thickness of the polishing stopping layer.

A masking layer, e.g., a photoresist layer, is then deposited and defined on layer of soft material 128 using conventional photolithography techniques, e.g., by exposing the masking layer to a light source and then developing the masking layer. The mask defined on layer of soft material 128 protects those regions of the IC substrate surface from etching where the circuitry for active areas is subsequently formed. By way of example, the mask is defined above those areas of the IC substrate layer where complementary metal oxide semiconductor (CMOS) transistor devices are subsequently fabricated. In a subsequent etching step, the unprotected regions of the composite layered stack, native oxide layer 124, and the IC substrate layer are etched to form trenches 118, 120 and 122 in the IC substrate surface. The masking layer remaining on layer of soft material 128 is then removed by wet etching or ashing, for example.

An insulating layer 116, e.g., silicon dioxide, is then deposited either by chemical vapor deposition (CVD) or spin-on glass (SOG), for example, on partially fabricated IC substrate 100 fillings trenches 118, 120 (in dense area) and 122 (in wide open area) with insulating layer 116 so that subsequently formed active areas in IC substrate 100 are isolated from each other. The deposition of insulating layer 116 may produce an insulating layer overburden on the composite layered stack, as shown in FIG. 2A.

Next, partially fabricated IC substrate surface 100 is subject to a pre-first stage of chemical-mechanical polishing (CMP) to remove the insulating layer overburden and form the structure shown in FIG. 2B. After the pre-first stage of chemical-mechanical polishing (CMP) concludes a substantial portion of the composite layered stack surface is exposed. FIG. 2B shows that the resulting surface of insulating layer 116 in the wide open areas may suffer from dishing, but the surface of insulating layer 116 in the dense areas may be substantially planar.

In one embodiment, the polishing conditions employed during pre-first stage of chemical-mechanical polishing (CMN) are substantially same as those conventionally employed to remove insulating layer overburden. Those skilled in the art will recognize, however, that the pre-first stage of CMP is required, if the insulating layer overburden is formed above the composite layered stack and that such a polishing step is not required if no insulating layer overburden is formed above the composite layered stack.

Figure 2D:
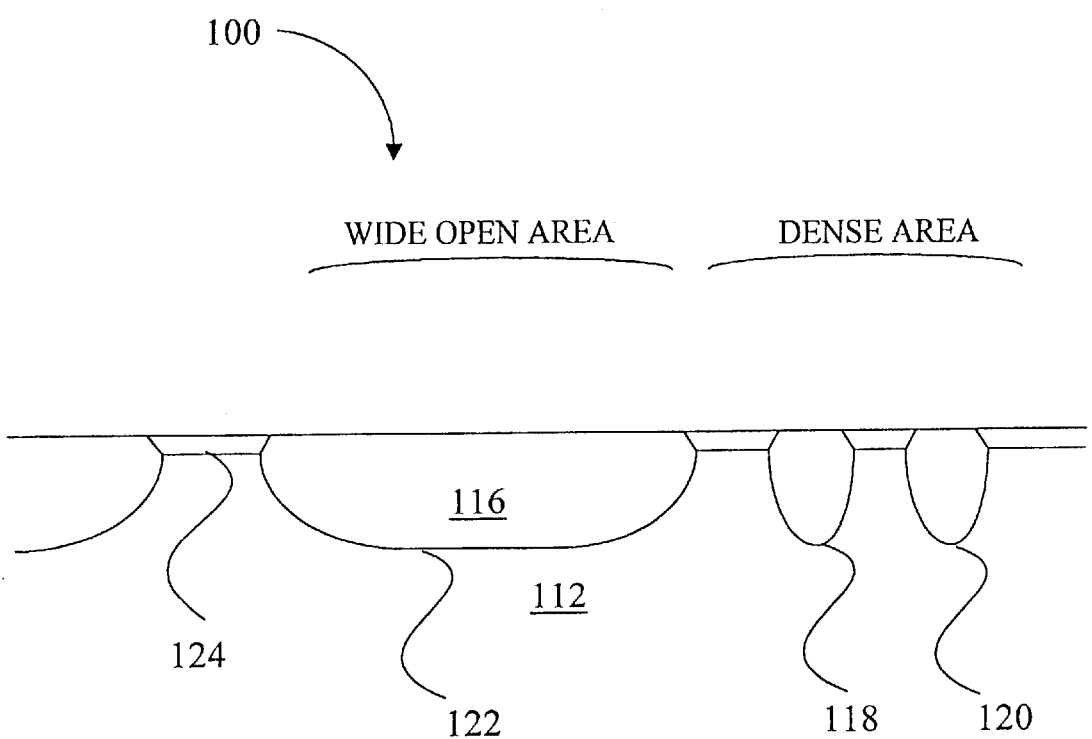

Next, partially fabricated IC substrate surface is subject to CMP to remove at least a substantial portion of the composite layered stack and insulating layer 116 adjacent to the composite layered stack at nearly a same rate to form a substantially planar surface of insulating layer above trenches 118, 120 and 122, as shown in FIG. 2D. In one embodiment, however, the polishing step described above is carried out in two different stages, a first and a second stage of CMP. The first stage of CMP is carried out under polishing conditions that produce a higher material removal rate of layer of soft material 128 than a material removal rate of insulating layer 116 that is disposed adjacent to layer of soft material 128. By way of example, if layer of soft material 128 includes tungsten, then the slurry composition employed dulling CMP may include a chemical, e.g., an oxidizing agent such as $Fe(NO_3)_3$, that chemically interacts with tungsten to form tungsten oxide and an abrasive, e.g., alumina ($Al_2O_3$), that physically removes tungsten oxide. Regardless of how the selectivity to the insulating layer is increased during CMP of layer of soft material 128, at the conclusion of the first stage of CMP, some amount of insulating layer 116 adjacent to the composite layered stack and above trench 122 (in the wide open area) is not removed and this portion of insulating layer 116 is shown as an outwardly protruding dome shaped structure 130 in FIG. 2C.

Next, in the second stage of CMP, the partially fabricated IC substrate surface shown VI in FIG. 2C is subject to polishing under conditions that produce a higher material removal rate of insulating layer 116 than a material removal rate of polishing stopping layer 114. By way of example, the polishing conditions in this step may be substantially similar to conventional oxide CMP described above and the slurry composition includes hydrogen peroxide ($H_2O_2$). As mentioned above, the second stage of (oxide) CMP has a higher selectivity to polishing stopping layer 114 and during this stage of CMP, the relatively thicker (dome shaped) insulating layer 116 adjacent to polishing stopping layer 114 experiences a greater degree of material removal than does polishing stopping layer 114. Stated another way, by employing a composite layered stack that includes a layer of soft material that polishes faster than the insulating layer, the present invention balances the material removal rates of the composite layered stack and the portion of insulating layer adjacent to the composite layered structure. Consequently, after the second stage of CMP has concluded, the surface of insulating layer 116 formed above trench 122 is substantially planar, as shown in FIG. 2D. Thus, it is important to note that a trench fabricated, according to the present invention, in the wide open area may not suffer from dishing.

In the embodiment where the layer of soft material is doped silicon dioxide, the CMP step of the present invention may be carried out in a single stage. The conditions for CMP, e.g., slurry composition, during this stage may be substantially the same. By way of example, if borophosphosilicate glass serves as the layer of soft material, then the slurry composition including $H_2O_2$ is employed throughout the CMP of the layered stack. It is important to bear in mind, however, that a substantially planar surface above the trenches is realized because the film removal rate of doped silicon dioxide is faster than the film removal rate of the insulating layer.

The modified STI processes of the present invention represent a marked improvement over the conventional STI process described above. By way of example, the present invention reduces the likelihood that the surface of insulating layer above the trench in the wide open area will suffer from dishing. Thus, the trenches fabricated according to the present invention effectively electrically isolate active areas of an IC from each other. Furthermore, the likelihood of encountering problems associated with current leakage is also reduced.

Although the foregoing invention has been described in some detail for purposes of clarity of understanding, it will be apparent that certain changes and modifications may be practiced within the scope of the appended claims. For example, while the specification has been described in terms of STI processes, there is in principle no reason why the likelihood of dishing in other IC features cannot be reduced similarly by the teachings of the present invention. Therefore, the present embodiments are to be considered as illustrative and not restrictive, and the invention is not to be limited to the details given herein, but may be modified within the scope of the appended claims.

What is claimed is:

1. A semiconductor wafer wherein trenches are formed in predefined areas, the trenches providing electrical isolation between adjacent active devices formed on the semiconductor wafer, the predefined areas comprising:

a semiconductor substrate;

a native oxide layer deposited on the substrate;

a first polish stop layer deposited on the native oxide layer;

a soft material layer deposited on the first polish stop layer and through which trenches are etched in the predefined areas, the trenches extending through the soft material layer, the first polish stop layer, the native oxide layer and a predefined portion of the semiconductor substrate;

an insulating layer deposited on the soft material layer, which insulating layer fills the trenches, wherein the rate of removal of the soft material layer under chemical-mechanical polishing is between 50% to 200% greater than the rate of removal of the insulating layer under chemical-mechanical polishing and the thickness of the soft material layer is between 1 to 10 times the thickness of the polish stop layer and the polish stop layer has a thickness between approximately 2,000 and approximately 20,000 angstroms.

2. The semiconductor wafer of claim 1 wherein the soft material layer includes at least one material selected from the group consisting of tungsten, doped silicon dioxide and polymer.

3. The semiconductor wafer of claim 1 wherein the first polish stop layer comprises at least one of silicon nitride and silicon oxynitride.

4. The semiconductor wafer of claim 1 wherein the insulating layer comprises silicon dioxide.

* * * * *